United States Patent
Takeyama et al.

(10) Patent No.: US 7,259,977 B2
(45) Date of Patent: Aug. 21, 2007

(54) SEMICONDUCTOR DEVICE HAVING HIERARCHIZED BIT LINES

(75) Inventors: Yasuhisa Takeyama, Yokohama (JP); Osamu Hirabayashi, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 189 days.

(21) Appl. No.: 10/952,824

(22) Filed: Sep. 30, 2004

(65) Prior Publication Data
US 2006/0023553 A1   Feb. 2, 2006

(30) Foreign Application Priority Data
Jul. 14, 2004   (JP)   ............... 2004-207811

(51) Int. Cl.
G11C 5/02 (2006.01)
G11C 11/00 (2006.01)
(52) U.S. Cl. .................. 365/63; 365/154; 365/156
(58) Field of Classification Search .............. 365/63, 365/154, 156, 230.03, 205, 207, 208
See application file for complete search history.

(56) References Cited

U.S. PATENT DOCUMENTS

| 5,724,292 | A | * | 3/1998 | Wada | ............... | 365/154 |
|---|---|---|---|---|---|---|
| 5,793,664 | A | * | 8/1998 | Nagata et al. | ............... | 365/63 |
| 6,359,803 | B1 | * | 3/2002 | Tanaka | ............... | 365/63 |
| 6,515,887 | B2 | * | 2/2003 | Fujimoto | ............... | 365/63 |
| 6,839,268 | B2 | * | 1/2005 | Osada et al. | ............... | 365/154 |
| 6,930,941 | B2 | * | 8/2005 | Nakase | ............... | 365/154 |
| 7,085,178 | B1 | * | 8/2006 | Proebsting et al. | ............... | 365/63 |

FOREIGN PATENT DOCUMENTS

| JP | 7-326186 | 12/1995 |
|---|---|---|
| JP | 2004-103159 | 4/2004 |

* cited by examiner

Primary Examiner—Trong Phan
(74) Attorney, Agent, or Firm—Oblon, Spivak, McClelland, Maier & Neustadt, P.C.

(57) ABSTRACT

A semiconductor device having hierarchized bit lines including an upper-layer bit line and a lower-layer bit line, includes at least one memory cell array to which the lower-layer bit line is connected and a selection transfer gate having an NMOS switching transistor and a PMOS switching transistor to connect the lower-layer bit line to the upper-layer bit line. The NMOS switching transistor and the PMOS switching transistor of the selection transfer gate are arranged opposite to each other in a column direction to sandwich the memory cell array.

21 Claims, 6 Drawing Sheets

SEMICONDUCTOR DEVICE HAVING HIERARCHIZED BIT LINES

CROSS-REFERENCE TO RELATED APPLICATIONS

This application is based upon and claims the benefit of priority from prior Japanese Patent Application No. 2004-207811, filed Jul. 14, 2004, the entire contents of which are incorporated herein by reference.

BACKGROUND OF THE INVENTION

1. Field of the Invention

The present invention relates to a semiconductor device. More specifically, the invention relates to a method of laying out a semiconductor memory having hierarchized bit lines.

2. Description of the Related Art

In semiconductor memories, recently, the problem that leakage current from bit lines increases as a metal oxide semiconductor (hereinafter referred to as MOS) decreases in size has become serious. To solve this problem, the following measures have been taken. The bit lines are hierarchized and the number of memory cells electrically connected to one bit line is reduced to decrease leakage current of the bit lines (see, for example, Jpn. Pat. Appln. KOKAI Publication No. 7-326186). If the bit lines are hierarchized, their capacities decrease and thus the memory access time is advantageously shortened.

If, however, the bit lines are hierarchized, a selection transfer gate is required to selectively connect the hierarchized bit lines to each other. This causes a problem that the reduction rate of the area of the entire layout will become lower than that of the area of MOS transistors.

There now follows a specific explanation of hierarchization of bit lines. The bit lines are usually formed throughout one column and hierarchized as a global bit line connected to a sense amplifier and a local bit line formed for each memory cell array. The global bit line and local bit line are connected to each other via a selection transfer gate that turns on in response to an address selection signal. The selection transfer gate is made up of a pair of MOS transistors (NMOS and PMOS switching transistors). The NMOS switching transistor is required to reliably apply a low potential (reference potential) to a memory cell when data is written to the memory cell. The PMOS switching transistor is required to sense a subtle variation in potential that is close to the power supply potential of the bit lines.

The global bit line and local bit line are formed of metal wiring layers of different levels. Usually, the global bit line is formed at a higher level than the local bit line. The interval between the global bit lines is very narrow in accordance with the size of each of memory cells, as is the interval between the local bit lines.

In the hierarchical bit-line architecture described above, the memory cells are formed in a memory cell array region on a semiconductor substrate. The PMOS and NMOS switching transistors of the selection transfer gate need to be formed in their respective N and P well regions on the semiconductor substrate. In order to electrically isolate the NMOS and PMOS switching transistors from each other, some distance is required from a boundary between the P and N well regions to the end of a MOS transistor formed on the P or N well region. This distance cannot be shortened so greatly, though the MOS transistors that make up a memory decrease in size year by year. Thus, the area of P and N well regions necessary for forming the NMOS and PMOS switching transistors becomes relatively large as the MOS transistors decrease in size. Consequently, the reduction rate of the area of the entire layout will become lower than that of the size of the MOS transistors.

If the NMOS and PMOS switching transistors are formed in different well regions, a P well region or an N well region is usually formed on one side of the memory cell array. In other words, one of the P and N well regions is located close to the memory cell array, while the other is located far from the memory cell array. The local bit line and global bit line are arranged in parallel above the MOS switching transistor located close to the memory cell array. The lower-level local bit line can be prevented from hindering a contact from being formed between the source/drain of the MOS switching transistor and the upper-level global bit line. In other words, the area of the entire layout will remarkably increase when it becomes necessary to increase an interval between the bit lines because of the contact.

As described above, the prior art semiconductor memory has the problem that the area of the entire layout is restricted by the area of the well region and the interval between the bit lines regardless of the reduction rate of the size of the MOS transistor.

BRIEF SUMMARY OF THE INVENTION

According to a first aspect of the present invention, there is provided a semiconductor device having hierarchized bit lines including an upper-layer bit line and a lower-layer bit line, comprising at least one memory cell array to which the lower-layer bit line is connected, and a selection transfer gate having an NMOS switching transistor and a PMOS switching transistor to connect the lower-layer bit line to the upper-layer bit line, wherein the NMOS switching transistor and the PMOS switching transistor of the selection transfer gate are arranged opposite to each other in a column direction to sandwich the memory cell array.

According to a second aspect of the present invention, there is provided a semiconductor device comprising a plurality of memory cell arrays provided at least in a column direction, hierarchized bit lines including a plurality of local bit lines connected to the memory cell arrays, respectively and one global bit line which is located higher than the local bit lines and to which the local bit lines are connected, and a plurality of selection transfer gates provided between the global bit line and the local bit lines and each having an NMOS switching transistor and a PMOS switching transistor in order to connect one of the local bit lines to the global bit line, wherein the NMOS switching transistor and the PMOS switching transistor of each of the selection transfer gates are arranged opposite to each other in a column direction to sandwich a memory cell array corresponding thereto.

According to a third aspect of the present invention, there is provided a semiconductor device comprising a plurality of memory cell arrays provided in a column direction and a row direction, a plurality of local bit lines connected to the memory cell arrays, respectively, one global bit line which is provided in the column direction and to which the local bit lines are connected, the global bit line being located higher than the local bit lines, and a plurality of selection transfer gates provided between the global bit line and the local bit lines and each having an NMOS switching transistor and a PMOS switching transistor in order to connect one of the local bit lines to the global bit line, an address selection signal being input to a gate of each of the NMOS switching transistor and the PMOS switching transistor in order to select one of the memory cell arrays, wherein one of the NMOS switching transistor and the PMOS switching transistor of each of the selection transfer gates is arranged on one side of a corresponding memory cell array in the column direction, and other is arranged on other side thereof in the column direction.

DETAILED DESCRIPTION OF THE INVENTION

Embodiments of the present invention will be described below with reference to the accompanying drawings.

First Embodiment

Figure 1:
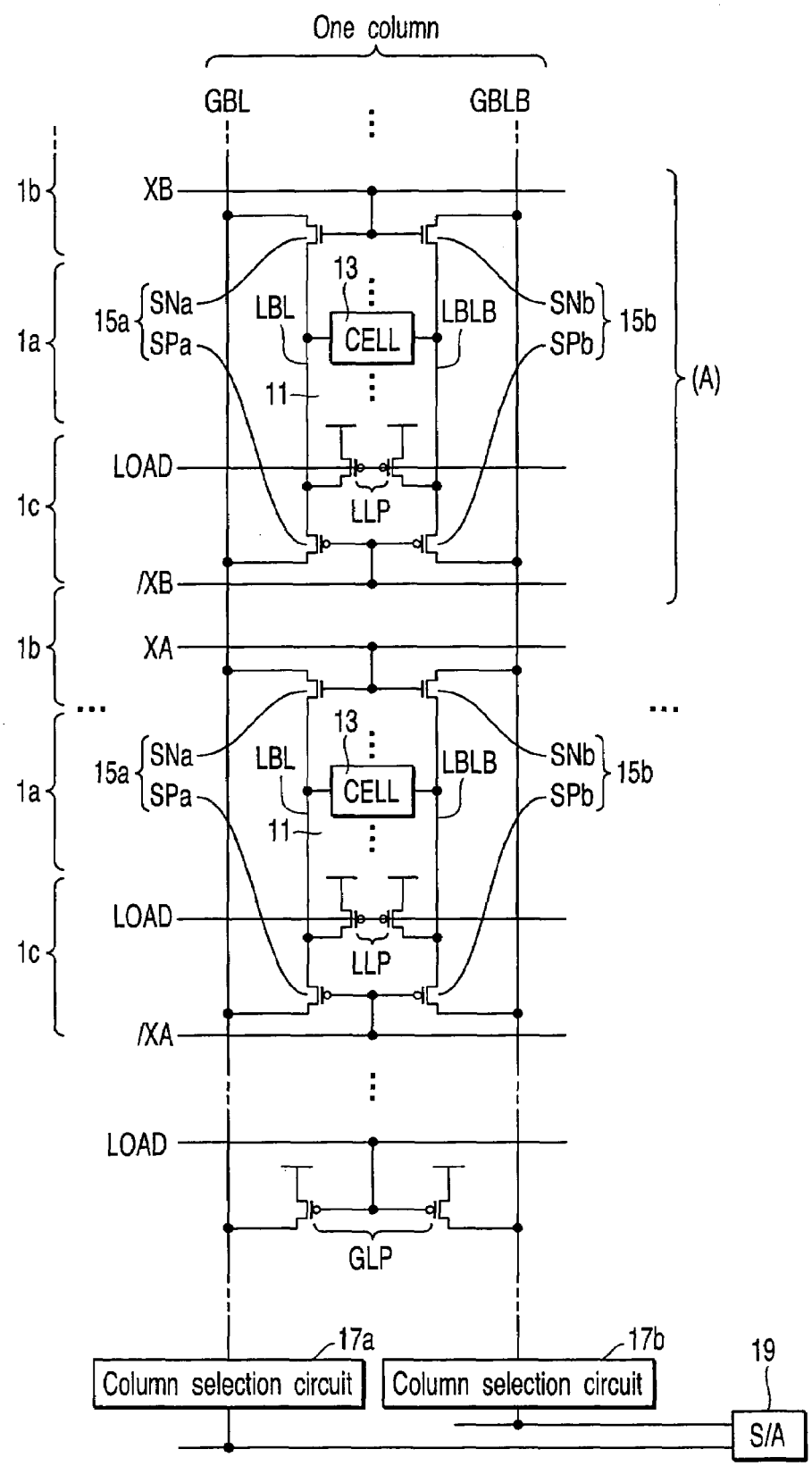
FIG. 1 is a circuit diagram of a semiconductor memory having hierarchized bit lines according to a first embodiment of the present invention.

FIG. 1 is a circuit diagram of a semiconductor memory having hierarchized bit lines according to a first embodiment of the present invention. FIG. 1 shows a circuit arrangement for one column, taking a static random access memory (hereinafter referred to as SRAM) as an example.

In FIG. 1, a plurality of memory cell arrays 11 are arranged on a semiconductor substrate (described later) in a column direction. Each of the memory cell arrays 11 includes a given number of memory cells (CELL) 13. Each of the memory cells 13 is connected to a pair of local bit lines LBL and LBLB. The local bit lines LBL and LBLB are used to read/write cell data from/to each of the memory cells 13.

The local bit lines LBL and LBLB are connected to paired global bit lines GBL and GBLB via selection transfer gates 15a and 15b, respectively. The global bit lines GBL and GBLB are provided for each column. The global bit lines GBL and GBLB in each column are connected to a sense amplifier (S/A) 19 via column selection circuits 17a and 17b. The local bit lines LBL and LBLB and global bit lines GBL and GBLB are arranged in parallel and formed of metal wiring layers of different levels. The global bit lines GBL and GBLB are located at a higher level and the local bit lines LBL and LBLB are located at a lower level.

The selection transfer gate 15a includes an NMOS switching transistor SNa and a PMOS switching transistor Spa. The selection transfer gate 15b includes an NMOS switching transistor SNb and a PMOS switching transistor Spb. The selection transfer gates 15a and 15b turn on/off in response to an address selection signal supplied to the gates of the NMOS switching transistors SNa and SNb and PMOS switching transistors SPa and SPb. If address selection signals XA and /XA are activated, their corresponding selection transfer gates 15a and 15b turn on. Thus, the local bit lines LBL and LBLB of the memory cell array 11, which correspond to the address selection signals XA and /XA, are electrically connected to the global bit lines GBL and GBLB. Similarly, if address selection signals XB and /XB are activated, their corresponding selection transfer gates 15a and 15b turn on. Thus, the local bit lines LBL and LBLB of the memory cell array 11, which correspond to the address selection signals XB and /XB, are electrically connected to the global bit lines GBL and GBLB.

In the first embodiment, the NMOS switching transistors SNa and SNb are arranged on one side of each memory cell array 11, and the PMOS switching transistors SPa and SPb are arranged on the other side thereof.

More specifically, one end of each local bit line LBL is connected to the global bit line GBL via the NMOS switching transistor SNa, and the other end is connected to the global bit line GBL via the PMOS switching transistor SPa. On the other hand, one end of each local bit line LBLB is connected to the global bit line GBLB via the NMOS switching transistor SNb, and the other end is connected to the global bit line GBLB via the PMOS switching transistor SPb.

Paired PMOS load transistors LLP are connected to the local bit lines LBL and LBLB, respectively. A load control signal LOAD is input to the gate of each of the PMOS load transistors LLP. One of the source and drain of one of the paired PMOS load transistors LLP is connected to the local bit line LBL and the other is connected to a power supply line. One of the source and drain of the other of the paired PMOS load transistors LLP is connected to the local bit line LBLB and the other is connected to a power supply line. Thus, the PMOS load transistors LLP charge the local bit lines LBL and LBLB at a power supply potential before they read cell data from the memory cell 13.

In contrast, paired PMOS load transistors GLP are connected to the global bit lines GBL and GBLB, respectively. A load control signal LOAD is input to the gate of each of the PMOS load transistors GLP. One of the source and drain of one of the paired PMOS load transistors GLP is connected to the global bit line GBL and the other is connected to a power supply line. One of the source and drain of the other of the paired PMOS load transistors GLP is connected to the global bit line GBLB and the other is connected to a power supply line. Thus, the PMOS load transistors GLP charge the global bit lines GBL and GBLB at a power supply potential before they read cell data from the memory cell 13.

In the actual semiconductor memory, a plurality of columns each corresponding to that shown in FIG. 1 are arranged adjacent to each other in the row direction.

Figure 2:
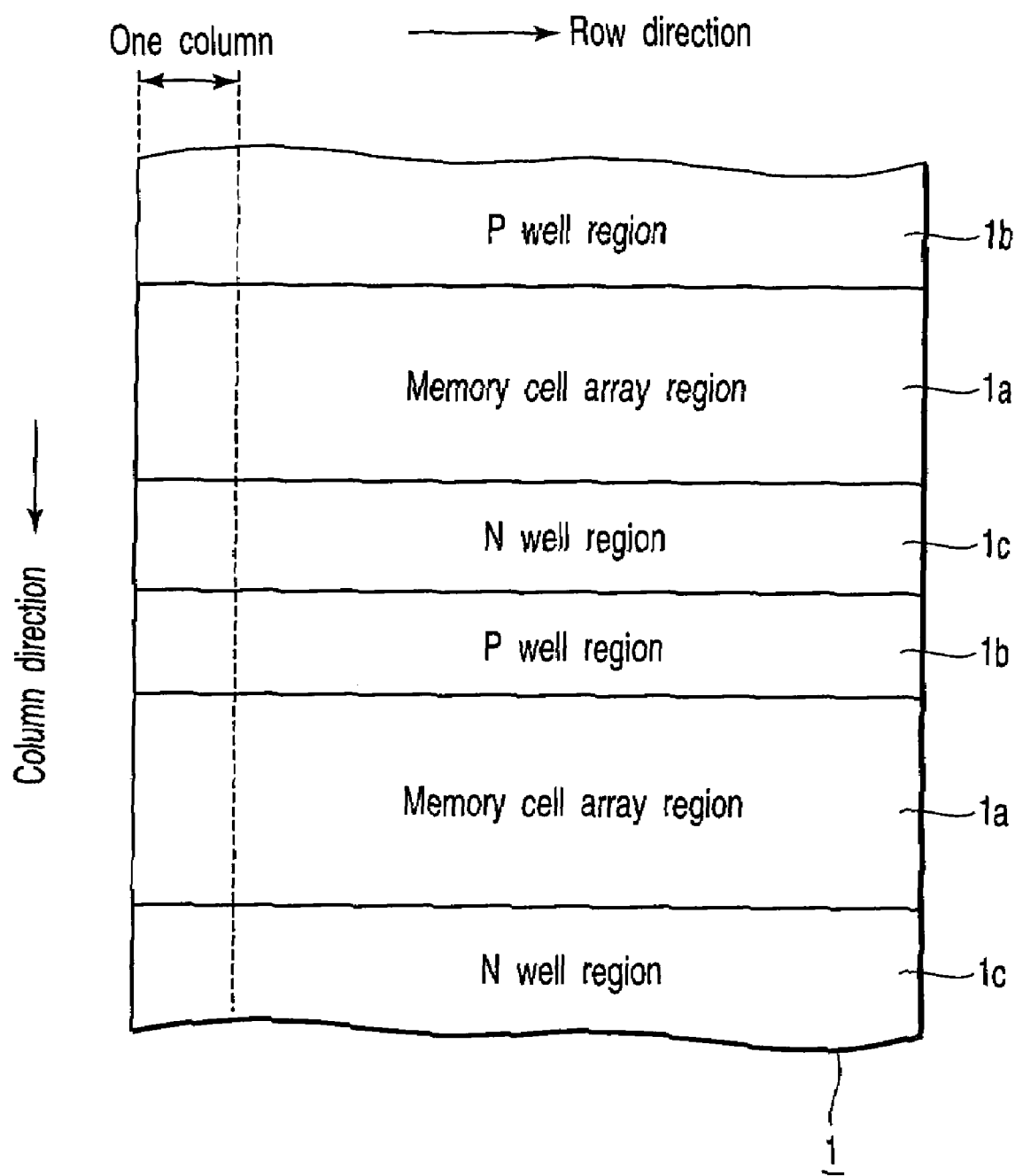
FIG. 2 is a schematic diagram of a layout of the semiconductor memory shown in FIG. 1.

FIG. 2 is a schematic diagram of a layout of the semiconductor memory shown in FIG. 1. Referring to FIG. 2, a plurality of memory cell array regions 1a are selectively provided in the surface section of the semiconductor substrate 1 in the column direction. A P well region 1b is formed on one side of each of the memory cell array regions 1a and an N well region 1c is formed on the other side thereof.

In the arrangement shown in FIG. 2, the memory cell array 11 is formed within the memory cell array region 1a. The NMOS switching transistors SNa and SNb that make up the selection transfer gates 15a and 15b, respectively are formed within the P well region 1b. On the other hand, PMOS switching transistors SPa and SPb that make up the selection transfer gates 15a and 15b, respectively are formed within the N well region 1c. The PMOS load transistors LLP are formed within the N well region 1c. The PMOS load transistors GLP are formed within an N well region that is not shown in FIG. 2.

Figure 3:
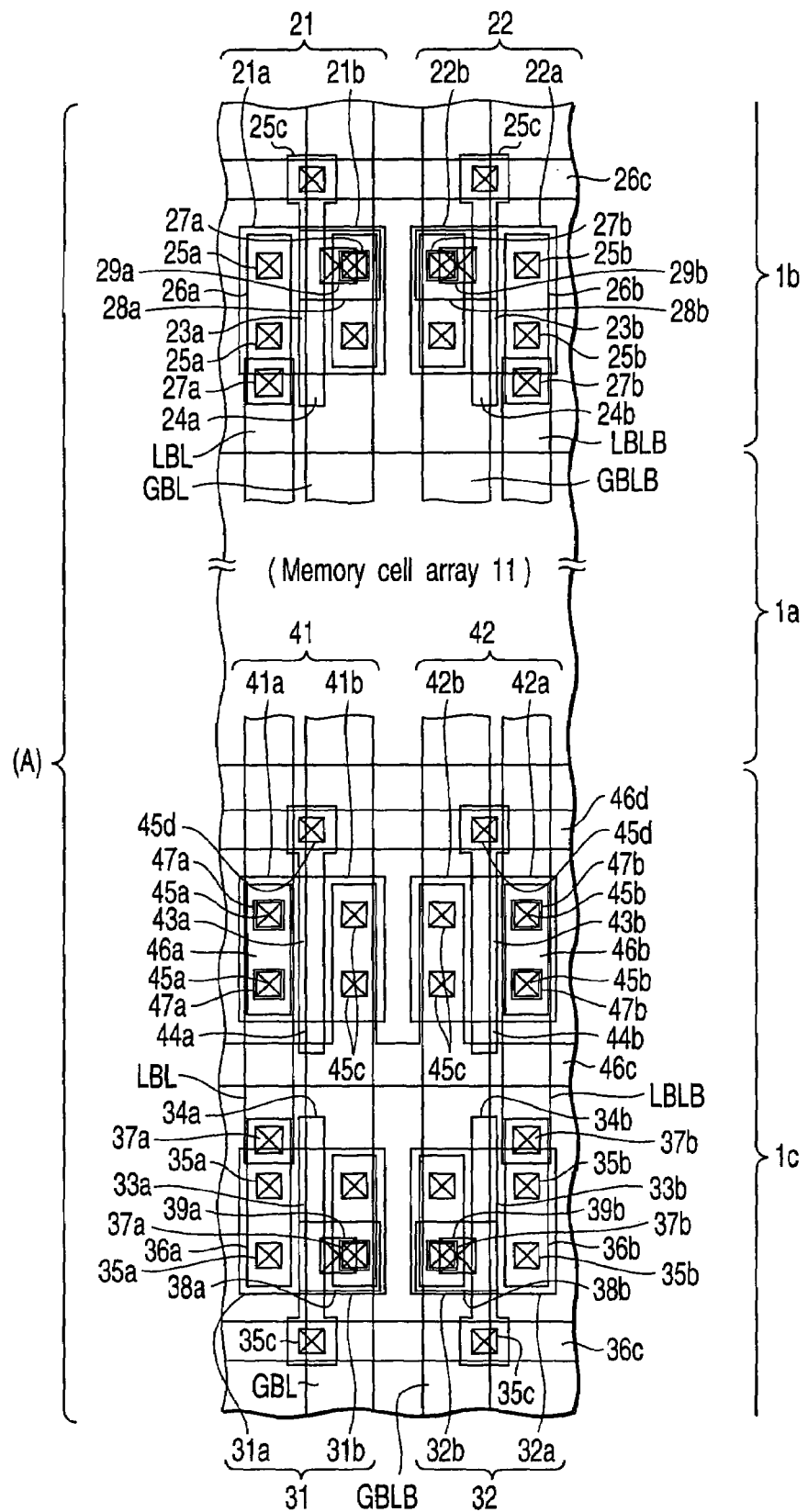
FIG. 3 is a partly perspective, plan view showing an example of the layout of the semiconductor memory shown in FIG. 1.

FIG. 3 specifically shows a method of laying out the semiconductor memory described above. A section for one column, which corresponds to e.g., the section indicated by (A) in FIG. 1, is taken as an example. The layout of the memory cell array 11 in this section is omitted from FIG. 3.

Referring to FIG. 3, first and second diffusion-layer regions 21 and 22 are formed in the surface area of the P well region 1b as active regions of an N-type conductivity. The first diffusion-layer region 21 has diffusion layers 21a and 21b serving as source and drain regions. A gate electrode 24a made of polysilicon is provided above the first diffusion-layer region 21 and between the diffusion layers 21a and 21b with a gate insulation film 23a between the gate electrode 24a and the region 21. The gate electrode 24a is formed in a direction parallel to the local bit lines LBL and LBLB and global bit lines GBL and GBLB. Thus, the NMOS switching transistor SNa that makes up the selection transfer gate 15a is formed.

First metal wiring layers 26a are connected to the diffusion layers 21a and 21b through contact layers 25a, respectively. One end of the local bit line LBL, which serves as a second metal wiring layer (lower layer), is connected to the first metal wiring layer 26a corresponding to the diffusion layer 21a through a contact layer 27a. On the other hand, a second metal wiring layer 28a is connected to the first metal wiring layer 26a corresponding to the diffusion layer 21b through a contact layer 27a. The global bit line GBL, which serves as a third metal wiring layer (upper layer) is connected to the second metal wiring layer 28a through a contact layer 29a.

Similarly, the second diffusion-layer region 22 has diffusion layers 22a and 22b serving as source and drain regions. A gate electrode 24b made of polysilicon is provided above the second diffusion-layer region 22 and between the diffusion layers 22a and 22b with a gate insulation film 23b between the gate electrode 24b and the region 22. The gate electrode 24b is formed in a direction parallel to the local bit lines LBL and LBLB and global bit lines GBL and GBLB. Thus, the NMOS switching transistor SNb that makes up the selection transfer gate 15b is formed.

First metal wiring layers 26b are connected to the diffusion layers 22a and 22b through contact layers 25b, respectively. One end of the local bit line LBLB, which serves as a second metal wiring layer (lower layer), is connected to the first metal wiring layer 26b corresponding to the diffusion layer 22a through a contact layer 27b. On the other hand, a second metal wiring layer 28b is connected to the first metal wiring layer 26b corresponding to the diffusion layer 22b through a contact layer 27b. The global bit line GBLB, which serves as a third metal wiring layer (upper layer), is connected to the second metal wiring layer 28b through a contact layer 29b.

An address selection signal line 26c is provided between the first and second diffusion-layer regions 21 and 22 and one end of the P well region 1b that is far from the memory cell array 11. The address selection signal line 26c is formed of a first metal wiring layer in a direction perpendicular to the gate electrodes 24a and 24b. The address selection signal line 26c is connected to the gate electrodes 24a and 24b through the contact layers 25c, respectively. Thus, an address selection signal XB is supplied to the gates of the NMOS switching transistors SNa and SNb of the selection transfer gates 15a and 15b.

In contrast, the PMOS switching transistors SPa and SPb of the selection transfer gates 15a and 15b and the PMOS load transistors LLP are formed in the N well region 1c. More specifically, first to fourth diffusion-layer regions 31, 32, 41 and 42 are formed in the surface section of the N well region 1c as active regions of a P-type conductivity. The first diffusion-layer region 31 has diffusion layers 31a and 31b serving as source and drain regions. A gate electrode 34a made of polysilicon is provided above the first diffusion-layer region 31 and between the diffusion layers 31a and 31b with a gate insulation film 33a between the gate electrode 34a and the region 31. The gate electrode 34a is formed in a direction parallel to the local bit lines LBL and LBLB and global bit lines GBL and GBLB. Thus, the PMOS switching transistor SPa that makes up the selection transfer gate 15a is formed.

First metal wiring layers 36a are connected to the diffusion layers 31a and 31b through contact layers 35a, respectively. The other end of the local bit line LBL, which serves as the second metal wiring layer (lower layer), is connected to the first metal wiring layer 36a corresponding to the diffusion layer 31a through a contact layer 37a. On the other hand, a second metal wiring layer 38a is connected to the first metal wiring layer 36a corresponding to the diffusion layer 31b through a contact layer 37a. The global bit line GBL, which serves as the third metal wiring layer (upper layer), is connected to the second metal wiring layer 38a through a contact layer 39a.

Similarly, the second diffusion-layer region 32 has diffusion layers 32a and 32b serving as source and drain regions. A gate electrode 34b made of polysilicon is provided above the second diffusion-layer region 32 and between the diffusion layers 32a and 32b with a gate insulation film 33b between the gate electrode 34b and the region 32. The gate electrode 34b is formed in a direction parallel to the local bit lines LBL and LBLB and global bit lines GBL and GBLB. Thus, the PMOS switching transistor SPb that makes up the selection transfer gate 15b is formed.

First metal wiring layers 36b are connected to the diffusion layers 32a and 32b through contact layers 35b, respectively. The other end of the local bit line LBLB, which serves as the second metal wiring layer (lower layer), is connected to the first metal wiring layer 36b corresponding to the diffusion layer 32a through a contact layer 37b. On the other hand, a second metal wiring layer 38b is connected to the first metal wiring layer 36b corresponding to the diffusion layer 32b through a contact layer 37b. The global bit line GBLB, which serves as the third metal wiring layer (upper layer), is connected to the second metal wiring layer 38b through a contact layer 39b.

An address selection signal line 36c is provided between the first and second diffusion-layer regions 31 and 32 and one end of the N well region 1c that is far from the memory cell array 11. The address selection signal line 36c is formed of a first metal wiring layer in a direction perpendicular to the gate electrodes 34a and 34b. The address selection signal line 36c is connected to the gate electrodes 34a and 34b through the contact layers 35c, respectively. Thus, an address selection signal /XB is supplied to the gates of the PMOS switching transistors SPa and SPb of the selection transfer gates 15a and 15b.

On the other hand, the third and fourth diffusion-layer regions 41 and 42 are provided between the first and second diffusion-layer regions 31 and 32 and the other end of the N well region 1c that is close to the memory cell array 11. The third diffusion-layer region 41 has diffusion layers 41a and 41b serving as source and drain regions. A gate electrode 44a made of polysilicon is provided above the third diffusion-layer region 41 and between the diffusion layers 41a and 41b with a gate insulation film 43a between the gate electrode 44a and the region 41. Similarly, the fourth diffusion-layer region 42 has diffusion layers 42a and 42b serving as source and drain regions. A gate electrode 44b made of polysilicon is provided above the second diffusion-layer region 42 and between the diffusion layers 42a and 42b with a gate insulation film 43b between the gate electrode 44b and the region 42. The gate electrodes 44a and 44b are formed in a direction parallel to the local bit lines LBL and LBLB and global bit lines GBL and GBLB. Thus, the PMOS load transistors LLP are configured.

A first metal wiring layer 46a is connected to the diffusion layer 41a through a contact layer 45a. The local bit line LBL, which serves as the second metal wiring layer (lower layer), is connected to the first metal wiring layer 46a through a contact layer 47a. On the other hand, a first metal wiring layer 46b is connected to the diffusion layer 42a through a contact layer 45b. The local bit line LBLB, which serves as the second metal wiring layer (lower layer), is connected to the first metal wiring layer 46b through a contact layer 47b. On the other hand, a power supply line 46c that is made of the first metal wiring layer is connected to the diffusion layers 41b and 42b through contact layers 45c, respectively.

A load control signal line 46d is provided between the third and fourth diffusion-layer regions 41 and 42 and the other end of the N well region 1c that is close to the memory cell array 11. The load control signal line 46d is formed of a first metal wiring layer in a direction perpendicular to the gate electrodes 44a and 44b and connected to the gate electrodes 44a and 44b through contact layers 45d, respectively. Thus, a load control signal LOAD is supplied to the gates of the PMOS load transistors LLP.

With the above arrangement, the local bit line LBL terminates at the source or drain of the NMOS switching transistor SNa and the source or drain of the PMOS switching transistor SPa, and the local bit line LBLB terminates at the source or drain of the NMOS switching transistor SNb and the source or drain of the PMOS switching transistor SPb. The local bit lines LBL and LBLB of the lower metal wiring layers can be prevented from hindering a contact from being formed between the global bit lines GBL and GBLB of the upper metal wiring layers and the source or drain of each of the NMOS switching transistors SNa and SNb and PMOS switching transistors SPa and SPb. The wiring layers can thus easily be formed without securing an additional area for connecting the global bit lines GBL and GBLB and the local bit lines LBL and LBLB with reliability. Consequently, the layout of bit lines can efficiently be designed and its area can be prevented from increasing.

In the arrangement of one column, it takes the longest time to read cell data from the memory cell 13 within the memory cell array 11 that is located farthest from the sense amplifier 19. In the selection transfer gates 15a and 15b in the memory cell array 11 that is located farthest from the sense amplifier 19, the PMOS switching transistors SPa and SPb are arranged on one side of the memory cell array 11, which is located closer to the sense amplifier 19. These PMOS switching transistors SPa and SPb play an important role in reading cell data and, in other words, time required for reading cell data from the memory cell 13 can be shortened.

Figure 4:
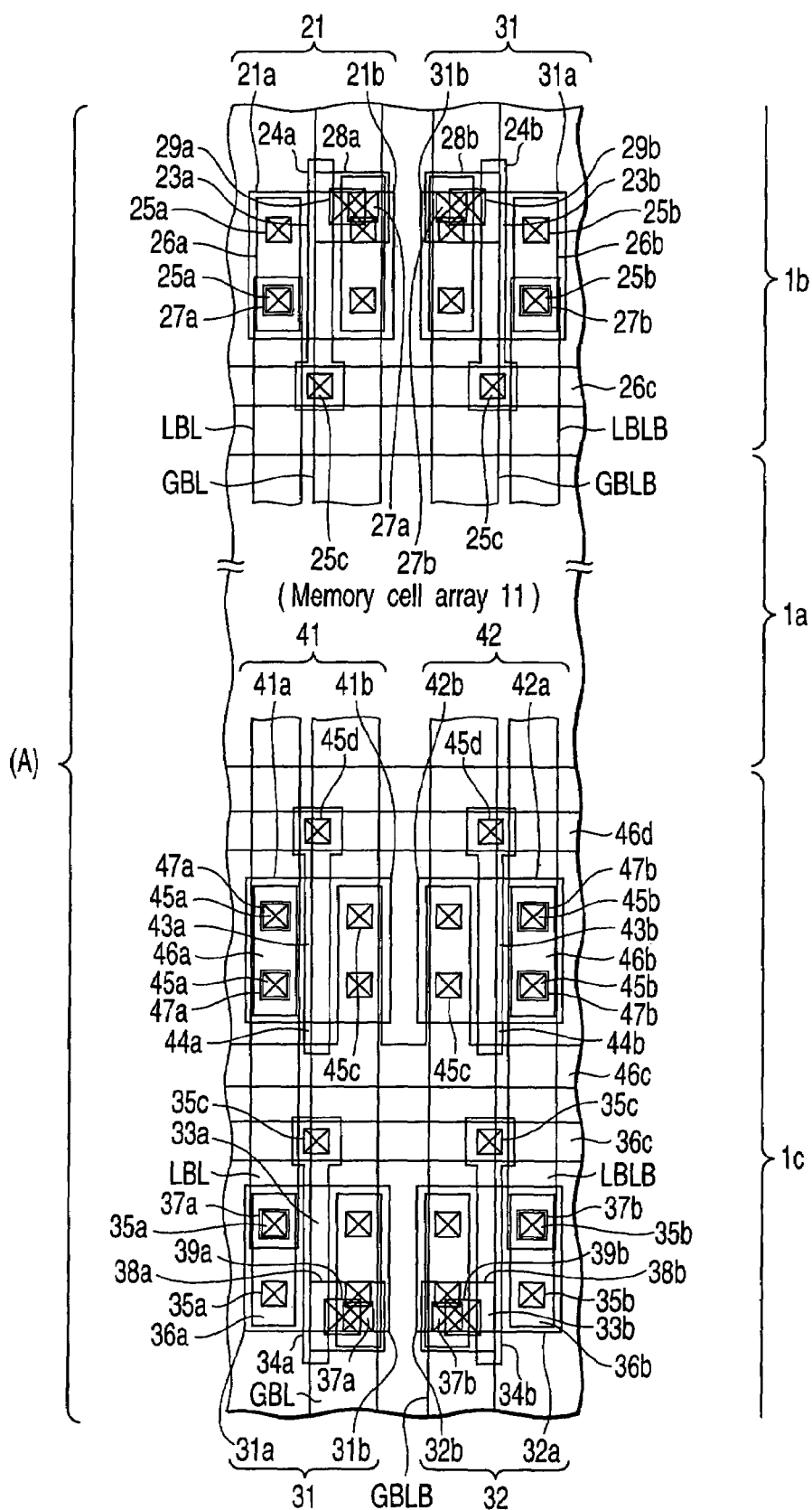
FIG. 4 is a partly perspective, plan view showing another example of the layout of the semiconductor memory shown in FIG. 1.

In the first embodiment, as shown in FIG. 3, the address selection signal line 26c is provided between the diffusion-layer regions 21 and 22 and one end of the P well region 1b that is far from the memory cell array 11, and the address selection signal line 36c is provided between the diffusion-layer regions 31 and 32 and one end of the N well region 1c that is far from the memory cell array 11. The present invention is not limited to this arrangement. For example, as shown in FIG. 4, the address selection signal line 26c can be provided between the diffusion-layer regions 21 and 22 and the other end of the P well region 1b that is close to the memory cell array 11, and the address selection signal line 36c can be provided between the diffusion-layer regions 31 and 32 and the other end of the N well region 1c that is close to the memory cell array 11.

Second Embodiment

Figure 5:
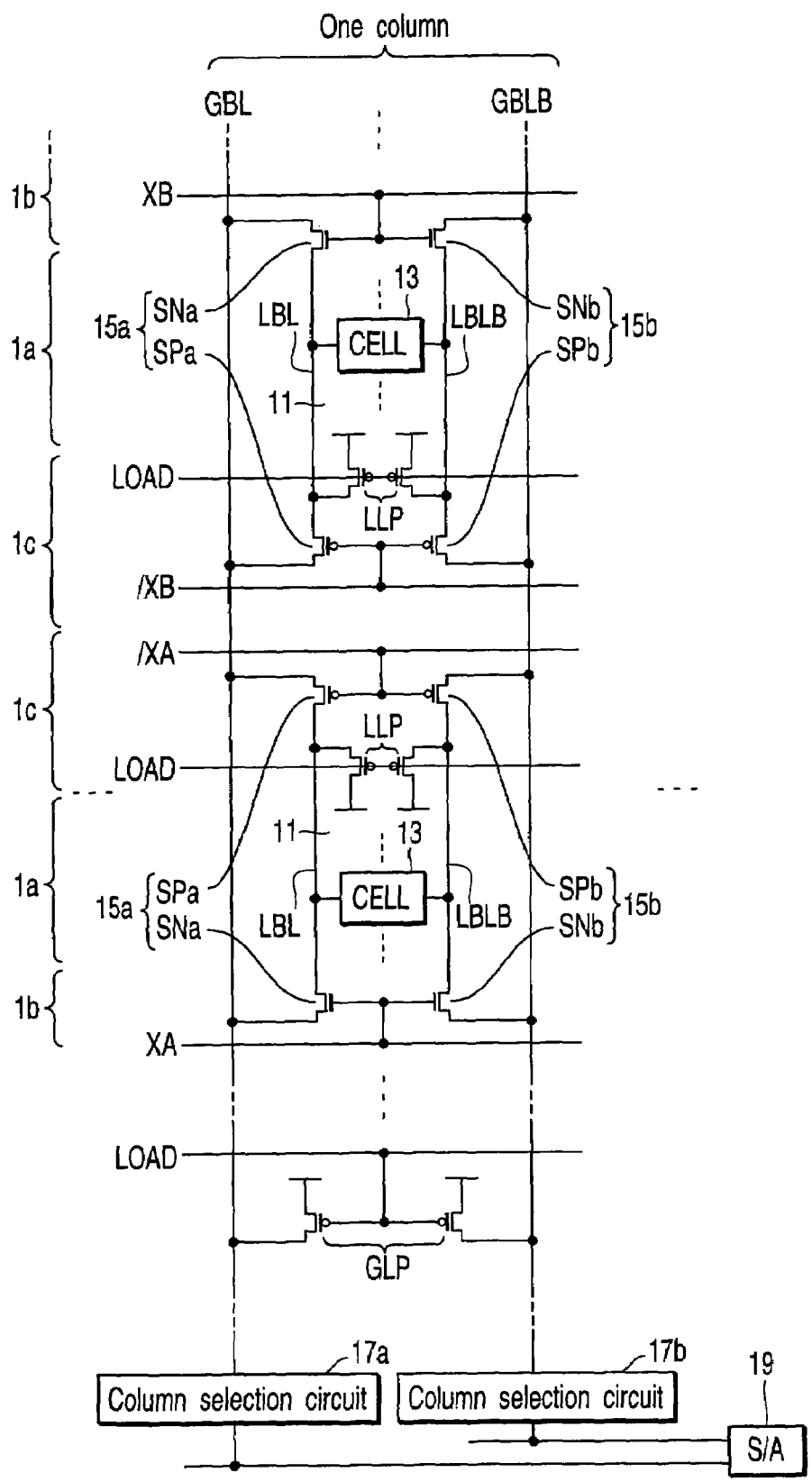
FIG. 5 is a circuit diagram of a semiconductor memory having hierarchized bit lines according to a second embodiment of the present invention.

FIG. 5 is a circuit diagram of a semiconductor memory having hierarchized bit lines according to a second embodiment of the present invention. FIG. 5 shows a circuit arrangement for one column taking an SRAM as an example. The same components as those of FIG. 1 are denoted by the same reference numerals and their detailed descriptions are omitted.

In the circuit arrangement for one column, the PMOS switching transistors SPa and SPb or NMOS switching transistors SNa and SNb of selection transfer gates 15a and 15b in one memory cell array 11 are arranged adjacent to those of transfer gates 15a and 15b in another memory cell array 11.

Figure 6:
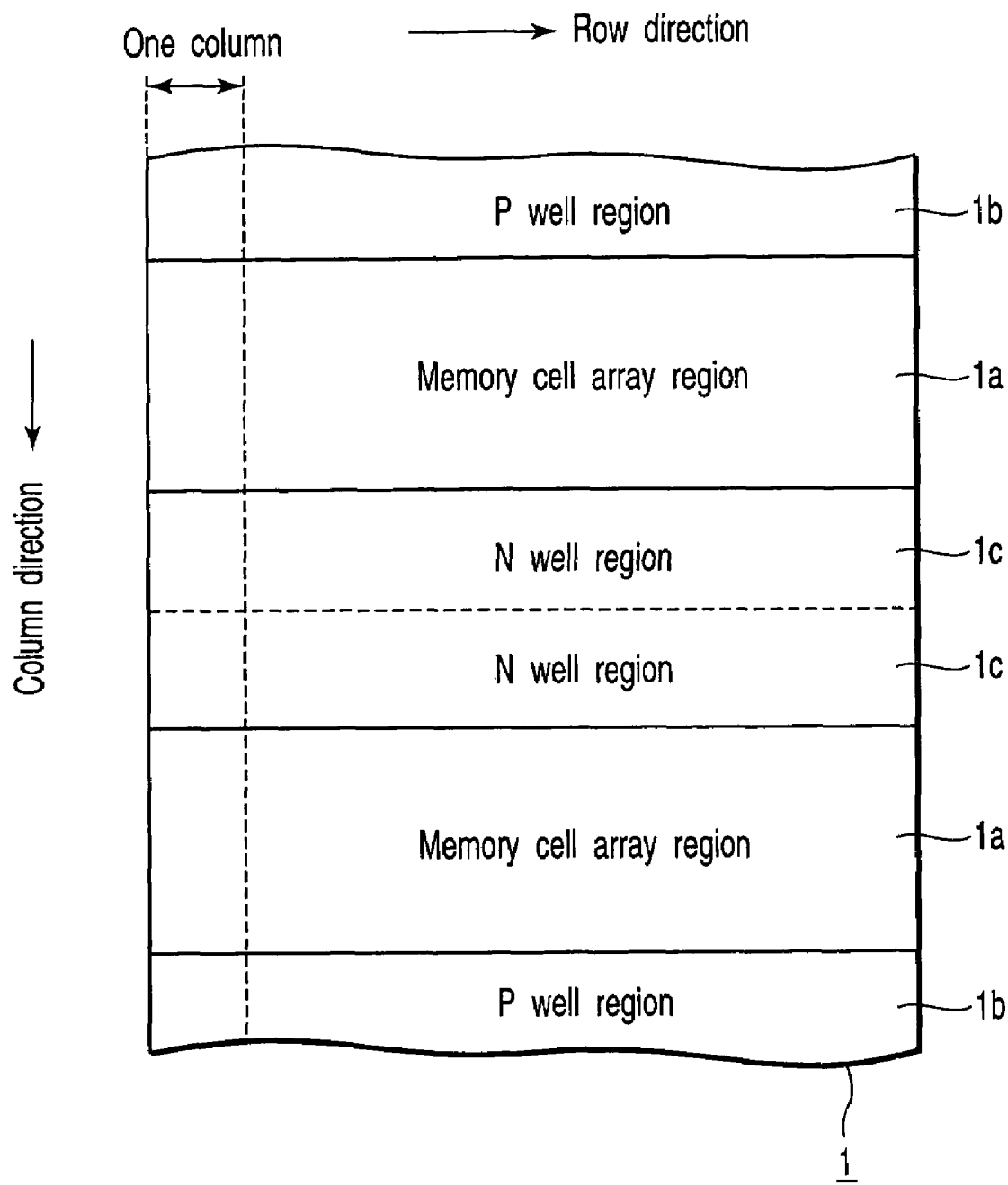
FIG. 6 is a schematic diagram of a layout of the semiconductor memory shown in FIG. 5.

FIG. 6 is a schematic diagram of a layout of the semiconductor memory shown in FIG. 5. Referring to FIG. 6, a plurality of memory cell array regions 1a are selectively provided in the surface section of the semiconductor substrate 1 in the column direction. A P well region 1b is formed on one side of one memory cell array region 1a, and an N well region 1c is formed on the other side thereof. In contrast, an N well region 1c is formed on one side of another memory cell array region 1a that is adjacent to the one memory cell array region 1a, and a P well region 1b is formed on the other side thereof. In other words, the N well regions 1c of adjacent two memory cell array regions 1a are contiguous to each other and so are the P well regions 1b of adjacent two memory cell array regions 1a. The N well regions and P well regions are arranged alternately.

With the above arrangement, the PMOS switching transistors SPa of adjacent selection transfer gates 15a can be arranged close to each other and so can be the PMOS switching transistors SPb of adjacent selection transfer gates 15b, and the NMOS switching transistors SNa of adjacent selection transfer gates 15a can be arranged close to each other and so can be the NMOS switching transistors SNb of adjacent selection transfer gates 15b. In other words, the PMOS switching transistors SPa of adjacent selection transfer gates 15a and the PMOS switching transistors SPb of adjacent selection transfer gates 15b can be arranged on the same N well region 1c, and the NMOS switching transistors SNa of adjacent selection transfer gates 15a and the NMOS switching transistors SNb of adjacent selection transfer gates 15b can be arranged on the same P well region 1b. In the first embodiment, the N well region 1c and P well region 1b need to be electrically isolated from each other, as need to be the NMOS switching transistors SNa and SNb and PMOS switching transistors SPa and SPb. In the second embodiment, however, they need not be electrically isolated from each other; accordingly, the entire layout can be decreased in area.

In the second embodiment, too, it is desirable that the PMOS switching transistors SPa and SPb of the selection transfer gates 15a and 15b in the memory cell array 11 that is located farthest from the sense amplifier 19 be arranged on one side of the memory cell array 11, which is closer to the sense amplifier 19.

In the first and second embodiments, a sense amplifier is common to a plurality of columns in a semiconductor memory having hierarchized bit lines. The present invention is not limited to this arrangement. For example, a sense amplifier can be provided for each of the columns, or a so-called single-end configuration can be used in which a sense amplifier is connected to only one of the global bit lines GBL and GBLB.

The bit lines can be charged with a potential other than the power supply potential, such as VDD/2 and VSS. If, in particular, the bit lines are charged with VSS, it is desirable that the load transistors be of an NMOS type. It is also desirable to arrange the NMOS switching transistors closer to the sense amplifier.

The present invention is not limited to the SRAM as a semiconductor memory, but can be applied to various semiconductor memories having hierarchized bit lines such as a dynamic random access memory (DRAM).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device having hierarchized bit lines including an upper-layer bit line and a lower-layer bit line, comprising:
at least one memory cell array to which a local bit line which is the lower-layer bit line is connected; and
a selection transfer gate having an NMOS switching transistor and a PMOS switching transistor to connect the local bit line to a global bit line which is the upper-layer bit line,
wherein the NMOS switching transistor of the selection transfer gate is arranged on one side in a column direction to sandwich said at least one memory cell array, and the PMOS switching transistor of the selection transfer gate is arranged on other side in the column direction to sandwich at least one memory cell array.

2. The semiconductor device according to claim 1, wherein an address selection signal is input to a gate of each of the NMOS switching transistor and the PMOS switching transistor in order to select the memory cell array.

3. The semiconductor device according to claim 1, wherein one end of the local bit line terminates at the NMOS switching transistor and other end thereof terminates at the PMOS switching transistor.

4. The semiconductor device according to claim 1, further comprising at least one sense amplifier to which the global bit line is connected, and
wherein the PMOS switching transistor is provided on one side which is opposite to the column direction to sandwich said at least one memory cell array and closer to said at least one sense amplifier.

5. The semiconductor device according to claim 1, further comprising a PMOS load transistor connected to the local bit line in order to control a potential of the local bit line, the PMOS load transistor being provided within an N well region in which the PMOS switching transistor is formed.

6. The semiconductor device according to claim 1, further comprising a PMOS load transistor connected to the global bit line in order to control a potential of the global bit line.

7. A semiconductor device comprising:
a plurality of memory cell arrays provided at least in a column direction;
hierarchized bit lines including a plurality of local bit lines connected to the memory cell arrays, respectively and one global bit line which is located higher than the local bit lines and to which the local bit lines are connected in common; and
a plurality of selection transfer gates provided between the global bit line and the local bit lines and each having an NMOS switching transistor and a PMOS switching transistor in order to connect one of the local bit lines to the global bit line,
wherein the NMOS switching transistor of each of the selection transfer gates is arranged on one side in a column direction to sandwich a memory cell array corresponding thereto, and the PMOS switching transistor of each of the selection transfer gates is arranged on the other side in the column direction to sandwich a memory cell array corresponding thereto.

8. The semiconductor device according to claim 7, wherein an address selection signal is input to a gate of each of the NMOS switching transistor and the PMOS switching transistor in order to select one of the memory cell arrays.

9. The semiconductor device according to claim 7, wherein one end of each of the local bit lines is connected to the NMOS switching transistor and other end thereof is connected to the PMOS switching transistor.

10. The semiconductor device according to claim 7, further comprising at least one sense amplifier to which the one global bit line is connected, and
wherein the PMOS switching transistor is provided on one side of a memory cell array that is located farthest from the sense amplifier, the one side being opposite to the column direction to sandwich the memory cell array and closer to said at least one sense amplifier.

11. The semiconductor device according to claim 7, wherein the NMOS switching transistor of one of the selection transfer gates and the PMOS switching transistor of another one of the selection transfer gates are arranged adjacent to each other.

12. The semiconductor device according to claim 7, wherein a PMOS load transistor to control a potential of each of the local bit lines is connected to each of the local bit lines, and the PMOS load transistor is provided within an N well region in which the PMOS switching transistor is formed.

13. The semiconductor device according to claim 7, wherein the NMOS switching transistor of one of the selection transfer gates and the NMOS switching transistor of another one of the selection transfer gates are arranged adjacent to each other, or the PMOS switching transistor of one of the selection transfer gates and the PMOS switching transistor of another one of the selection transfer gates are arranged adjacent to each other.

14. The semiconductor device according to claim 13, wherein the NMOS switching transistor of said one of the selection transfer gates and the NMOS switching transistor of said another one of the selection transfer gates are formed in a single P well region, and the PMOS switching transistor of said one of the selection transfer gates and the PMOS switching transistor of said another one of the selection transfer gates are formed in a single N well region.

15. The semiconductor device according to claim 14, further comprising a PMOS load transistor formed in the N well region in order to control a potential of each of the local bit lines.

16. A semiconductor device comprising:
a plurality of memory cell arrays provided in a column direction and a row direction;
a plurality of local bit lines connected to the memory cell arrays, respectively;
one global bit line which is provided in the column direction and to which the local bit lines are connected in common, the global bit line being located higher than the local bit lines; and
a plurality of selection transfer gates provided between the global bit line and the local bit lines and each having an NMOS switching transistor and a PMOS switching transistor in order to connect one of the local bit lines to the global bit line, an address selection signal being input to a gate of each of the NMOS switching transistor and the PMOS switching transistor in order to select one of the memory cell arrays,
wherein one of the NMOS switching transistor and the PMOS switching transistor of each of the selection transfer gates is arranged on one side of a corresponding memory cell array in the column direction, and other is arranged on other side of the corresponding memory cell array in the column direction.

17. The semiconductor device according to claim 16, wherein one end of each of the local bit lines is connected to the NMOS switching transistor and other end thereof is connected to the PMOS switching transistor.

18. The semiconductor device according to claim 16, further comprising at least one sense amplifier to which the one global bit line is connected, and
wherein the PMOS switching transistor is provided on one side of a memory cell array that is located farthest from the sense amplifier, the one side being opposite to the column direction to sandwich a memory cell array and closer to said at least one sense amplifier.

19. The semiconductor device according to claim 16, wherein the NMOS switching transistor of one of the selection transfer gates and the NMOS switching transistor of another one of the selection transfer gates are arranged adjacent to each other, or the PMOS switching transistor of one of the selection transfer gates and the PMOS switching transistor of another one of the selection transfer gates are arranged adjacent to each other.

20. The semiconductor device according to claim 19, wherein the NMOS switching transistor of said one of the selection transfer gates and the NMOS switching transistor of said another one of the selection transfer gates are formed in a single P well region, and the PMOS switching transistor of said one of the selection transfer gates and the PMOS switching transistor of said another one of the selection transfer gates are formed in a single N well region.

21. The semiconductor device according to claim 20, further comprising a PMOS load transistor formed in the N well region in order to raise a potential of each of the local bit lines to a given potential.

* * * * *